United States Patent
Koh

(10) Patent No.: US 7,465,675 B2
(45) Date of Patent: Dec. 16, 2008

(54) METHOD OF FORMING A PHASE CHANGE MEMORY DEVICE HAVING A SMALL AREA OF CONTACT

(75) Inventor: Gwan-Hyeob Koh, Seoul (KR)

(73) Assignee: Samsung Electronics Co., Ltd. (KR)

( * ) Notice: Subject to any disclaimer, the term of this patent is extended or adjusted under 35 U.S.C. 154(b) by 143 days.

(21) Appl. No.: 11/149,499

(22) Filed: Jun. 9, 2005

(65) Prior Publication Data

US 2006/0046509 A1 Mar. 2, 2006

(30) Foreign Application Priority Data

Aug. 31, 2004 (KR) .................. 10-2004-0069361

(51) Int. Cl.
*H01L 21/31* (2006.01)
*H01L 21/469* (2006.01)

(52) U.S. Cl. .............................. 438/758; 257/E21.209

(58) Field of Classification Search ................. 438/758; 257/E21.209
See application file for complete search history.

(56) References Cited

U.S. PATENT DOCUMENTS

| 6,031,287 | A | 2/2000 | Harshfield |
| 6,514,788 | B2 * | 2/2003 | Quinn ........................ 438/95 |
| 6,815,704 | B1 * | 11/2004 | Chen ............................. 257/2 |
| 6,831,330 | B2 * | 12/2004 | Harshfield ................. 257/330 |
| 6,841,793 | B2 * | 1/2005 | Lee ................................. 257/3 |
| 6,972,428 | B2 * | 12/2005 | Maimon ......................... 257/2 |
| 7,135,727 | B2 * | 11/2006 | Lee et al. ................... 257/296 |
| 7,291,556 | B2 * | 11/2007 | Choi et al. .................. 438/672 |
| 2003/0075778 | A1 * | 4/2003 | Klersy ........................ 257/536 |
| 2004/0026686 | A1 | 2/2004 | Lung ............................. 257/30 |
| 2004/0195604 | A1 * | 10/2004 | Hwang et al. ............... 257/295 |
| 2005/0045915 | A1 * | 3/2005 | Lee ............................. 257/202 |
| 2005/0191804 | A1 * | 9/2005 | Lai et al. .................... 438/238 |
| 2006/0175597 | A1 * | 8/2006 | Happ ............................. 257/2 |
| 2006/0245236 | A1 * | 11/2006 | Zaidi ........................ 365/129 |
| 2006/0257787 | A1 * | 11/2006 | Kuo et al. ............... 430/270.13 |

FOREIGN PATENT DOCUMENTS

JP 2002-150605 5/2002

* cited by examiner

*Primary Examiner*—Bradley W. Baumeister
*Assistant Examiner*—Igwe U. Anya
(74) *Attorney, Agent, or Firm*—Mills & Onello, LLP

(57) ABSTRACT

Methods of fabricating a phase change memory device having a small area of contact are provided. The method includes forming a lower interlayer insulating layer on a semiconductor substrate, and forming a lower conductor pattern within the lower inter-insulating layer. A first insulating layer pattern which crosses a top surface of the lower conductor pattern is formed on the semiconductor substrate having the lower conductor pattern. A conductive spacer pattern electrically connected to the lower conductor pattern is formed on a sidewall of the first insulating layer pattern. A first interlayer insulating layer is formed on the semiconductor substrate having the conductive spacer pattern. The first interlayer insulating layer and the conductive spacer pattern are planarized to form a bottom electrode. A second insulating layer pattern which crosses a top surface of the bottom electrode and exposes a portion of the bottom electrode is formed on the semiconductor substrate having the bottom electrode. A phase change material spacer electrically connected to the bottom electrode is formed on a sidewall of the second insulating layer pattern. A second interlayer insulating layer is formed on the semiconductor substrate having the phase change material spacer. The second interlayer insulating layer and the phase change material spacer are planarized to form a phase change material pattern.

20 Claims, 16 Drawing Sheets

METHOD OF FORMING A PHASE CHANGE MEMORY DEVICE HAVING A SMALL AREA OF CONTACT

CROSS-REFERENCE TO RELATED APPLICATION

This application claims the benefit of Korean Patent Application No. 2004-0069361, filed Aug. 31, 2004, the contents of which are hereby incorporated herein by reference in their entirety.

BACKGROUND OF THE INVENTION

1. Field of the Invention

The present invention relates to methods of fabricating a semiconductor memory device and, more particularly, to methods of fabricating a phase change memory device having a small area of contact.

2. Description of the Related Art

Semiconductor memory devices may be classified as volatile memory devices or non-volatile memory devices, depending on whether data is retained when the power supply is interrupted. The non-volatile memory device has an advantage in that data stored therein is not erased even when the power supply is interrupted. Accordingly, the non-volatile memory device is widely employed in a mobile communication system, a memory card, and so forth.

A flash memory device is widely used as the non-volatile memory device. The flash memory device usually employs memory cells having a stacked gate structure. The stacked gate structure includes a tunnel insulating layer, a floating gate, an inter-gate dielectric layer, and a control gate electrode which are sequentially stacked on a channel region. A principle of programming and erasing data into and from the flash memory cell employs methods of tunneling charges through the tunnel insulating layer. In order to enhance reliability and program efficiency of the flash memory device, a film quality of the tunnel insulating layer should be improved and a coupling rate of the cell should be increased. However, such tasks as the improvement of film quality and the increase of cell coupling rate become obstacles to enhancement of a degree of integration of the flash memory device.

As a result, research has been conducted on development of a new memory device having a non-volatile memory characteristic and an effective structure for enhancing the degree of integration, which have yielded a representative phase change memory device. A unit cell of the phase change memory device includes an access device and a data storage element serially connected to the access device. The data storage element has a bottom electrode electrically connected to the access device and a phase change material layer in contact with the bottom electrode. The phase change material layer is one which is electrically switched between an amorphous state and a crystalline state or between several resistivity states under the crystalline state based on the amount of current applied thereto.

FIG. 1 is a partial cross-sectional view schematically illustrating a conventional phase change memory device, and FIG. 2 is a plan view illustrating an active contact surface of a phase change material layer in a conventional phase change memory device.

Referring to FIGS. 1 and 2, a typical phase change memory device includes a lower interlayer insulating layer 12 disposed in a predetermined region of a semiconductor substrate 1, a lower interconnection 10 disposed within the lower interlayer insulating layer 12, an upper interlayer insulating layer 13 covering the lower interconnection 10, an upper interconnection 18 disposed on the upper interlayer insulating layer 13, a phase change material pattern 16 disposed within the upper interlayer insulating layer 13, a bottom electrode 14 electrically connected between the phase change material pattern 16 and the lower interconnection 10, and a top electrode 17 electrically connected between the phase change material pattern 16 and the upper interconnection 18.

When a program current flows through the bottom electrode 14, Joule heat is generated at an interface 20 (hereinafter, referred to as 'active contact surface') between the phase change material layer 16 and the bottom electrode 14. The Joule heat transforms a portion 22 (hereinafter, referred to as an 'active volume portion') of the phase change material pattern 16 to an amorphous or crystalline state. A resistivity of the active volume portion 22 having the amorphous state is higher than that of the active volume portion 22 having the crystalline state. Accordingly, by detecting a current flowing through the active volume portion 22 in a read mode, information stored in the unit cell of the phase change memory device may be discriminated as a logical one (1) or logical zero (0).

In this case, the program current should be increased in proportion to increased size of the active contact surface 20. The access device should be designed so as to have sufficient current drivability to supply the program current. However, in order to enhance the current drivability, the area occupied by the access device is increased. That is, it is advantageous to improve the degree of integration of the phase change memory device by decreasing the size of the active contact surface 20. In addition, it is required to optimize the volume of the active volume portion 22.

A method for decreasing the active contact surface 20 is disclosed in U.S. Pat. No. 6,514,788 B2 entitled "Method for manufacturing contacts for a chalcogenide memory device" to Quinn.

FIG. 3 is an intermediate process plan view illustrating a method of forming a contact for a chalcogenide memory device disclosed in U.S. Pat. No. 6,514,788 B2, and FIG. 4 is a process cross-sectional view taken along the line X-X of FIG. 3.

Referring to FIGS. 3 and 4, the method of forming the contact of the chalcogenide memory device includes forming a first oxide layer on a predetermined region of a semiconductor substrate and forming a via hole within the first oxide layer. A metal conductor 35 covering sidewalls of the via hole is deposited and then a second oxide layer 34 filling the via hole is formed. A third oxide layer is formed to cover a predetermined region on the metal conductor 35. A silicon nitride spacer 39 is formed on sidewalls of the third oxide layer, and the third oxide layer is removed. The metal conductor 35 is etched using the silicon nitride spacer 39 as a mask to form a bottom electrode. As a result, the bottom electrode which has a size smaller than a limit of a photolithography process may be formed.

When the phase change material pattern 16 is formed to be larger than the bottom electrode 14 as shown in FIGS. 1 and 2, the active volume portion 22 is formed in a hemisphere. That is, the effect of decreasing the active volume portion 22 may be reduced based on the size and the arrangement shape of the phase change material pattern 16 even when the size of the bottom electrode 14 is decreased to minimize the active contact surface 20.

In conclusion, a technique of optimizing the size and the arrangement shape of the phase change material pattern 16 as well as decreasing the size of the bottom electrode 14 is required.

SUMMARY OF THE INVENTION

Embodiments of the invention provide a method of fabricating a phase change memory device capable of optimizing the volume of an active volume portion.

In one aspect, the invention is directed to methods of fabricating a phase change memory device having a small area of contact. This method includes forming a lower interlayer insulating layer on a semiconductor substrate, and forming a lower conductor pattern within the lower inter-insulating layer. A first insulating layer pattern which crosses a top surface of the lower conductor pattern and exposes a portion of the lower conductor pattern is formed on the semiconductor substrate having the lower conductor pattern. A conductive spacer pattern electrically connected to the lower conductor pattern is formed on a sidewall of the first insulating layer pattern. A first interlayer insulating layer is formed on the semiconductor substrate having the conductive spacer pattern. The first interlayer insulating layer and the conductive spacer pattern are planarized to form a bottom electrode. A second insulating layer pattern which crosses a top surface of the bottom electrode and exposes a portion of the bottom electrode is formed on the semiconductor substrate having the bottom electrode. A phase change material spacer electrically connected to the bottom electrode is formed on a sidewall of the second insulating layer pattern. A second interlayer insulating layer is formed on the semiconductor substrate having the phase change material spacer. The second interlayer insulating layer and the phase change material spacer are planarized to form a phase change material pattern.

The first insulating layer pattern may include a silicon nitride layer or a silicon oxynitride layer.

The conductive spacer pattern may be formed by forming a conductor on the semiconductor substrate having the first insulating layer pattern, anisotropically etching the conductor to form a conductive spacer electrically connected to the lower conductor pattern on a sidewall of the first insulating layer pattern, and patterning the conductive spacer.

Top surfaces of the bottom electrode, the first insulating layer pattern and the first interlayer insulating layer may be substantially exposed on the same surface. The bottom electrode may also be etched to have a top surface of the bottom electrode recessed to be lower than top surfaces of the first interlayer insulating layer and the first insulating layer pattern. The bottom electrode may include a titanium nitride (TiN) layer or a titanium aluminum nitride (TiAlN) layer. A width of the bottom electrode is determined by the deposition thickness of the conductor and the anisotropic etching to the conductor, so that it may be formed to have a width smaller than a limit of a photolithography process.

The second insulating layer pattern may include a silicon nitride layer or a silicon oxynitride layer.

The phase change material spacer may be formed by forming a phase change material layer on the semiconductor substrate having the second insulating layer pattern, and etching the phase change material layer. A width of the phase change material pattern is determined by the deposition thickness of the phase change material layer and the anisotropic etching to the phase change material layer, so that it may be formed to have a width not more than a limit of a photolithography process. The phase change material pattern may be formed of a chalcogenide layer. For example, the phase change material pattern may be formed of a GST (GeSbTe) alloy layer doped with at least one of nitride and silicon.

The bottom electrode and the phase change material pattern may be formed to intersect each other at a plane intersection angle of 0° to 90°.

An upper interconnection electrically connected to the phase change material pattern may be formed on the phase change material pattern. The upper interconnection may be formed of a barrier metal pattern and an upper metal pattern which are sequentially stacked. The upper metal pattern may be formed of a conductor such as aluminum. The barrier metal pattern may be formed of at least one layer selected from a titanium (Ti) layer and a titanium nitride (TiN) layer.

In another aspect, the invention is directed to other methods of fabricating a phase change memory device having a small area of contact. The method includes forming a lower interlayer insulating layer on a semiconductor substrate, and forming a lower conductor pattern within the lower inter-insulating layer. A first insulating layer pattern which crosses a top surface of the lower conductor pattern and exposes a portion of the top surface of the lower conductor pattern is formed on the semiconductor substrate having the lower conductor pattern. A conductive spacer pattern electrically connected to the lower conductor pattern is formed on a sidewall of the first insulating layer pattern. A first interlayer insulating layer is formed on the semiconductor substrate having the conductive spacer pattern. The first interlayer insulating layer and the conductive spacer pattern are planarized to form a bottom electrode. The bottom electrode is etched to have a top surface of the bottom electrode recessed to be lower than top surfaces of the first interlayer insulating layer and the first insulating layer pattern. A second insulating layer which crosses a top surface of the bottom electrode and exposes a portion of the top surface of the bottom electrode is formed on the semiconductor substrate having the bottom electrode. A phase change material spacer electrically connected to the bottom electrode is formed on a sidewall of the second insulating layer pattern. A second interlayer insulating layer is formed on the semiconductor substrate having the phase change material spacer. The second interlayer insulating layer and the phase change material spacer are planarized to form a phase change material pattern. An upper interconnection electrically connected to the phase change material pattern is formed on the phase change material pattern.

BRIEF DESCRIPTION OF THE DRAWINGS

The foregoing and other objects, features and advantages of the invention will be apparent from the more particular description of preferred aspects of the invention, as illustrated in the accompanying drawings in which like reference characters refer to the same parts throughout the different views. The drawings are not necessarily to scale, emphasis instead being placed upon illustrating the principles of the invention.

DETAILED DESCRIPTION OF THE INVENTION

Figure 1:
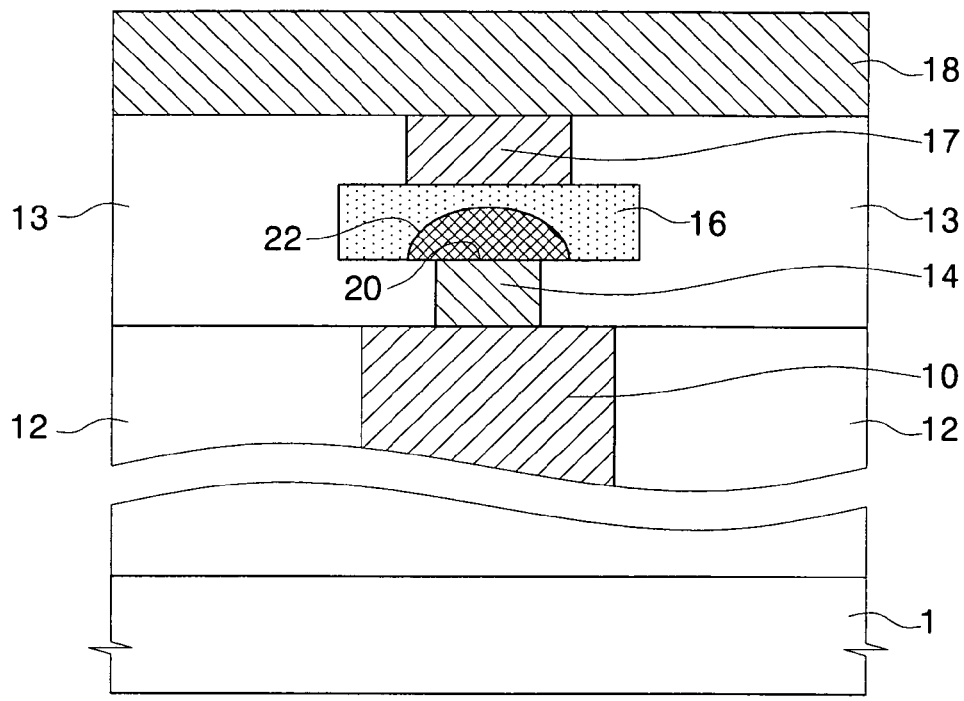
FIG. 1 is a cross-sectional view schematically illustrating a conventional phase change memory device.
Figure 2:
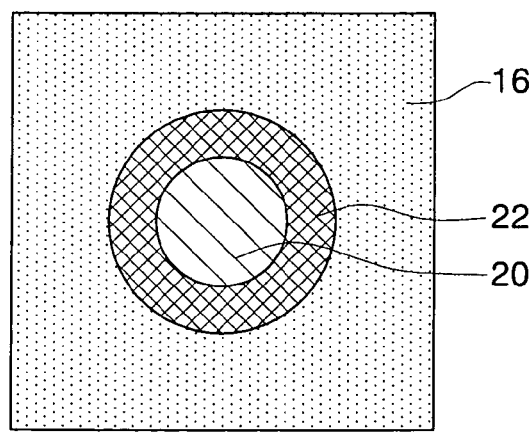
FIG. 2 is a plan view illustrating an active contact surface of a phase change material layer in a conventional phase change memory device.
Figure 3:
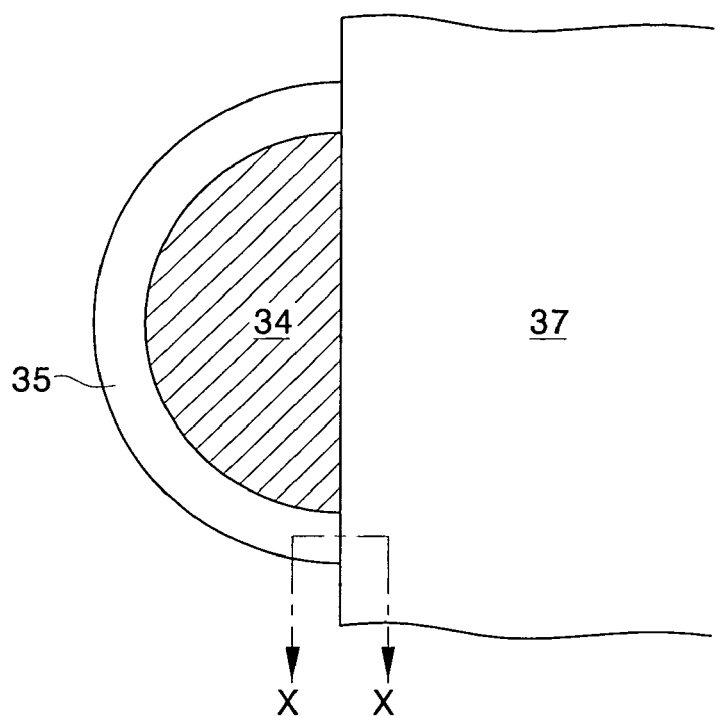
FIG. 3 is an intermediate process plan view illustrating a method of forming a contact of a phase change memory device in accordance with the prior art.
Figure 4:
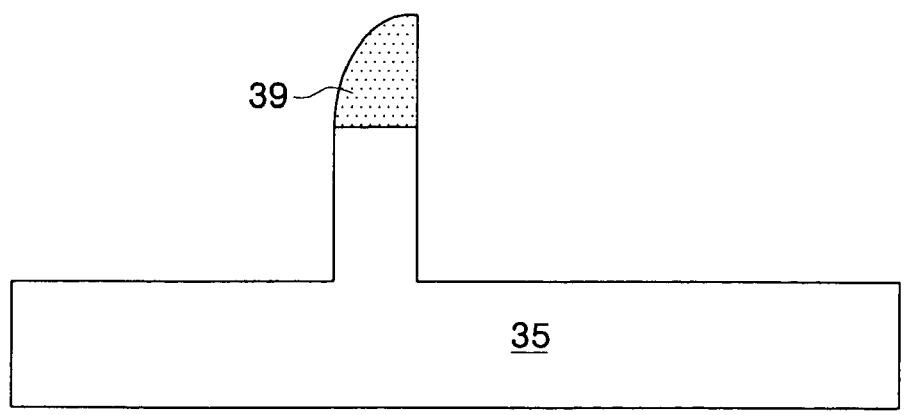
FIG. 4 is a process cross-sectional view taken along the line X-X of FIG. 3.

The present invention will now be described more fully hereinafter with reference to the accompanying drawings, in which preferred embodiments of the invention are shown. In the drawings, the thickness of layers and regions are exaggerated for clarity. In addition, when a layer is described to be formed on other layer or on a substrate, which means that the layer may be formed on the other layer or on the substrate, or a third layer may be interposed between the layer and the other layer or the substrate. Like numbers refer to like elements throughout the specification.

FIGS. 5 to 24 are plan views and cross-sectional views in a process order illustrating methods of fabricating a phase change memory device in accordance with embodiments of the present invention. Specifically, FIGS. 5, 7, 9, 11, 13, 15, 17, 19, 21, and 23 are schematic plan views illustrating a portion of a semiconductor substrate in a process order of methods of fabricating a phase change memory device, FIGS. 6, 8, 10, 12, and 14 are schematic cross-sectional views taken along the line I-I' of FIGS. 5, 7, 9, 11, and 13, respectively, and FIGS. 16, 18, 20, 22, and 24 are schematic cross-sectional views taken along the line II-II' of FIGS. 15, 17, 19, 21, and 23, respectively.

Figure 25:
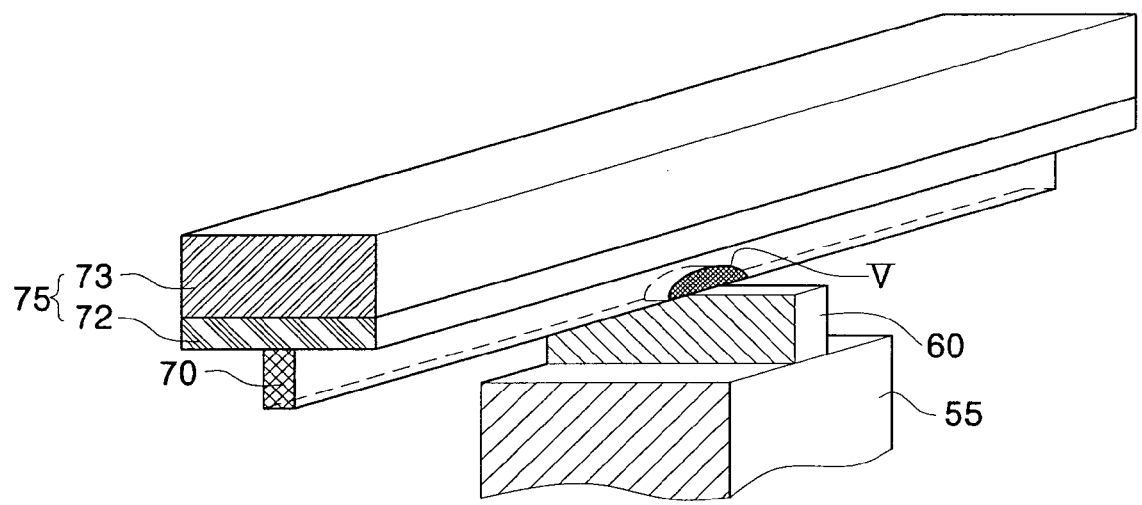
FIG. 25 is a schematic perspective view illustrating a method of arranging a phase change material pattern and a bottom electrode of a phase change memory device in accordance with embodiments of the present invention.
Figure 26:
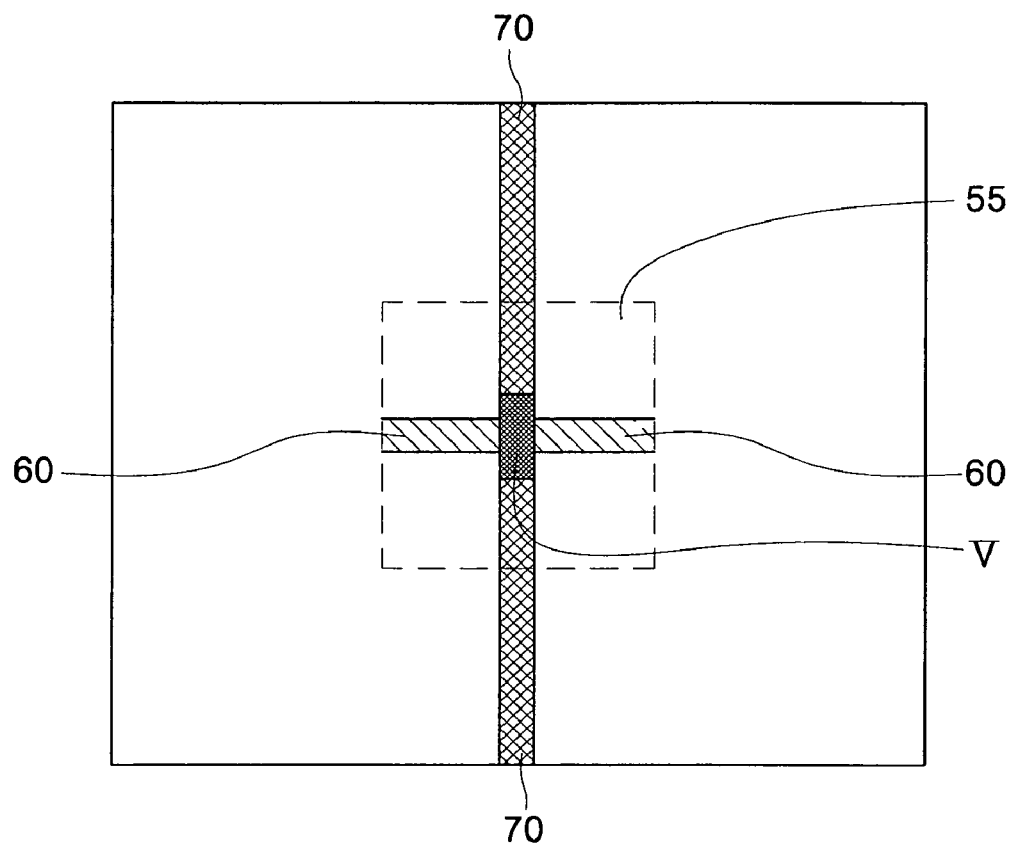
FIG. 26 is a schematic plan view illustrating a method of arranging a phase change material pattern and a bottom electrode in accordance with embodiments of the present invention.
Figure 27:
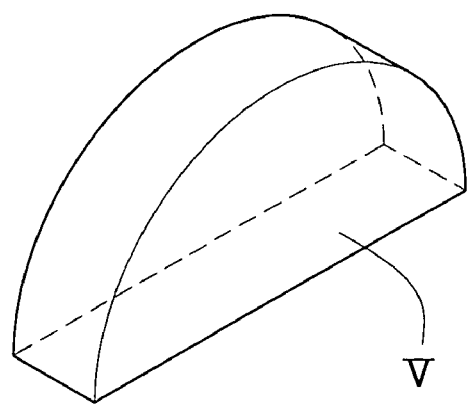
FIG. 27 is a schematic perspective view illustrating an active volume portion (i.e. V of FIG. 26) of a phase change memory device in accordance with embodiments of the present invention.

In addition, FIG. 25 is a schematic perspective view illustrating a method of arranging a phase change material pattern and a bottom electrode of a phase change memory device in accordance with embodiments of the present invention, FIG. 26 is a plan view illustrating a method of arranging a phase change material pattern and a bottom electrode, and FIG. 27 is a perspective view illustrating an active volume portion (i.e. V of FIG. 26) of a phase change memory device in accordance with embodiments of the present invention.

Figure 5:
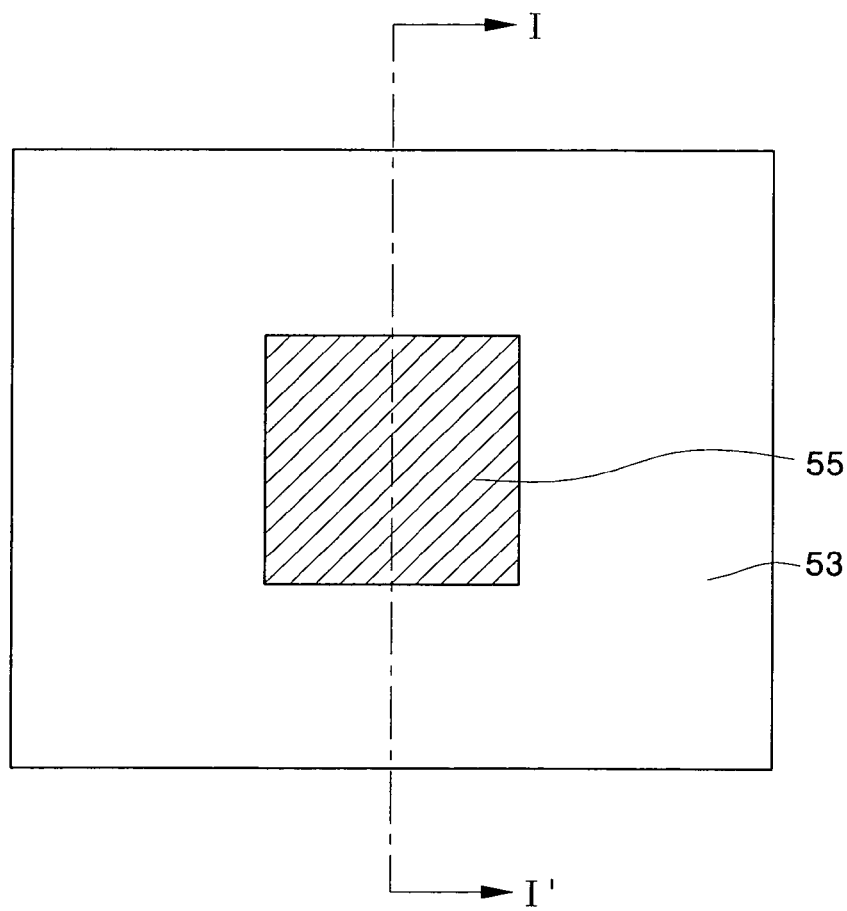
FIGS. 5, 7, 9, 11, 13, 15, 17, 19, 21, and 23 are schematic plan views illustrating a portion of a semiconductor substrate during a process of fabricating a phase change memory device in accordance with embodiments of the present invention.
Figure 6:
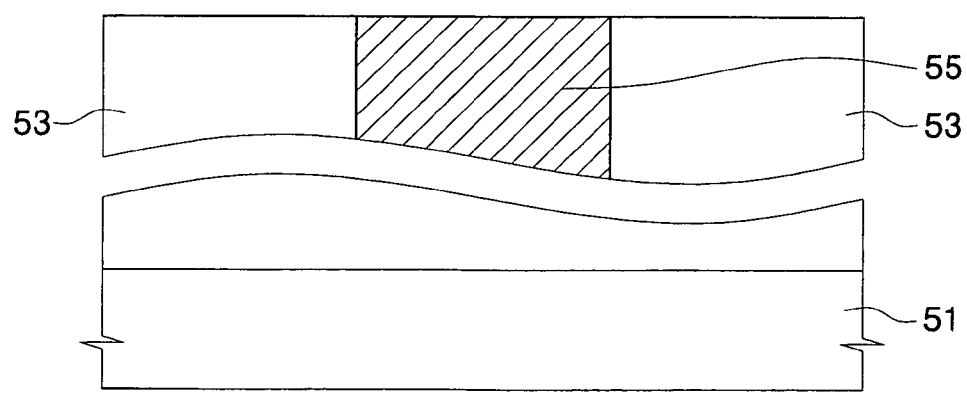
FIGS. 6, 8, 10, 12, and 14A are schematic cross-sectional views taken along the line I-I' of FIGS. 5, 7, 9, 11, and 13, respectively.

Referring to FIGS. 5 and 6, a lower interlayer insulating layer 53 is formed on a semiconductor substrate 51. Typically, a lower circuit such as an access transistor is formed on the semiconductor substrate 51, however, it will be omitted for simplicity of description. A lower conductor pattern 55 is formed within the lower interlayer insulating layer 53, and a top surface of the lower conductor pattern 55 is exposed.

The lower interlayer insulating layer 53 may be formed of a silicon oxide layer or a silicon oxynitride layer using a chemical vapor deposition (CVD) method. The lower conductor pattern 55 may be formed of a conductor such as a tungsten layer. The lower conductor pattern 55 may be an interconnection connected to an adjacent circuit or a pad connected to the lower circuit, however, it is assumed hereinafter that the lower conductor pattern is the pad.

Figure 7:
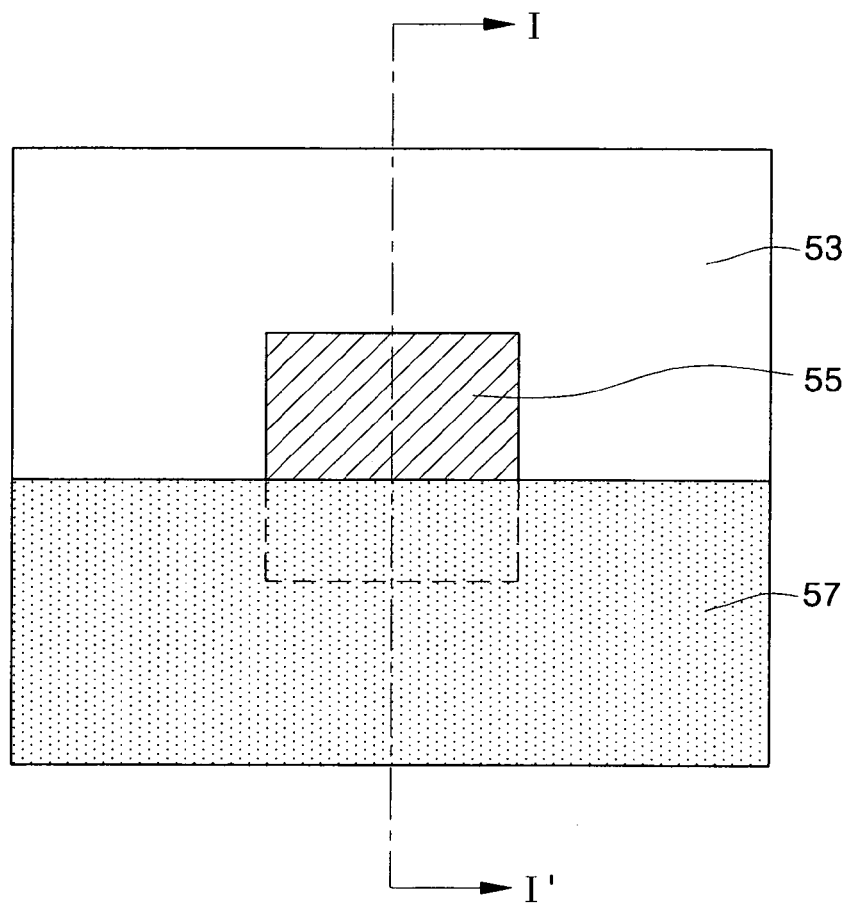
Figure 8:
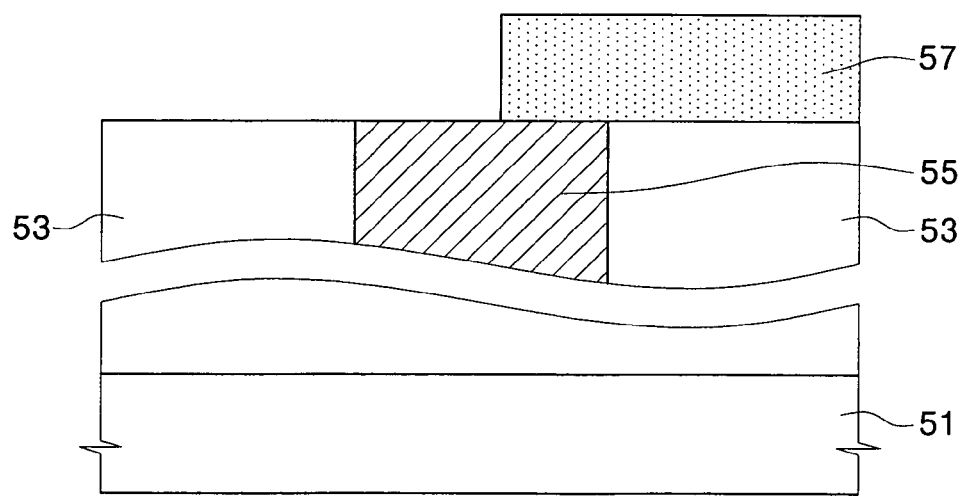

Referring to FIGS. 7 and 8, a first insulating layer is formed on the entire surface of the semiconductor substrate 51 having the lower conductor pattern 55. The first insulating layer may be formed of a silicon nitride layer or a silicon oxynitride layer using a CVD method. The first insulating layer is then patterned to form a first insulating layer pattern 57 which crosses the lower conductor pattern 55. As a result, a portion of the top surface of the lower conductor pattern 55 is covered by the first insulating layer pattern 57 and the rest of the top surface of the lower conductor pattern 55 is exposed.

Figure 9:
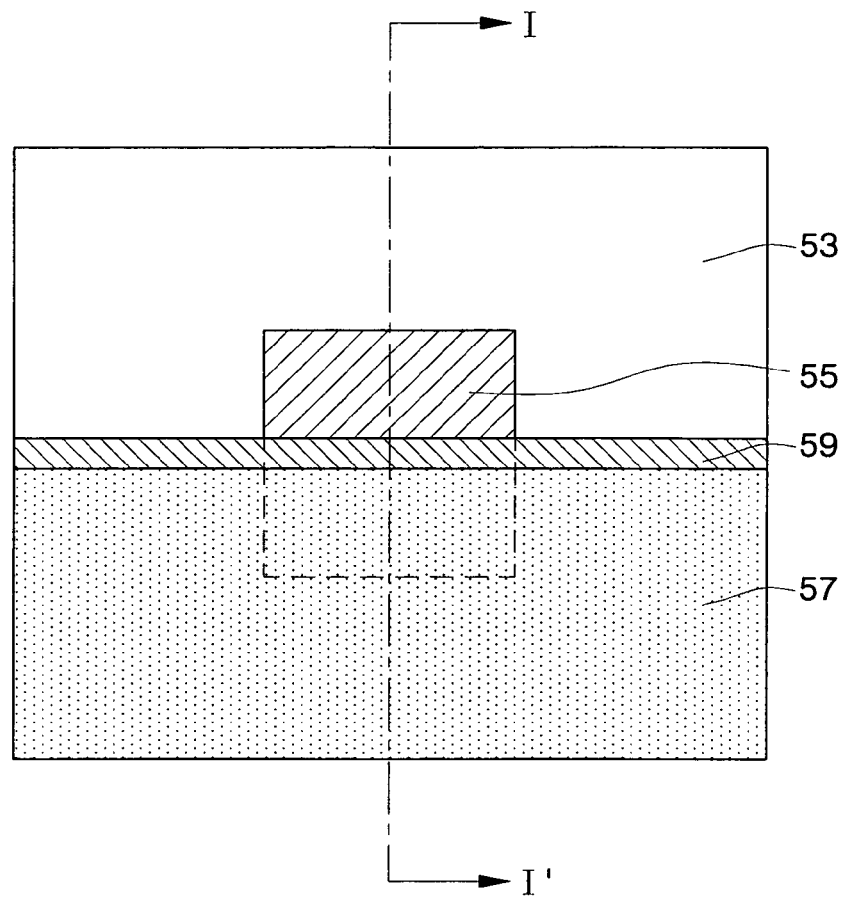
Figure 10:
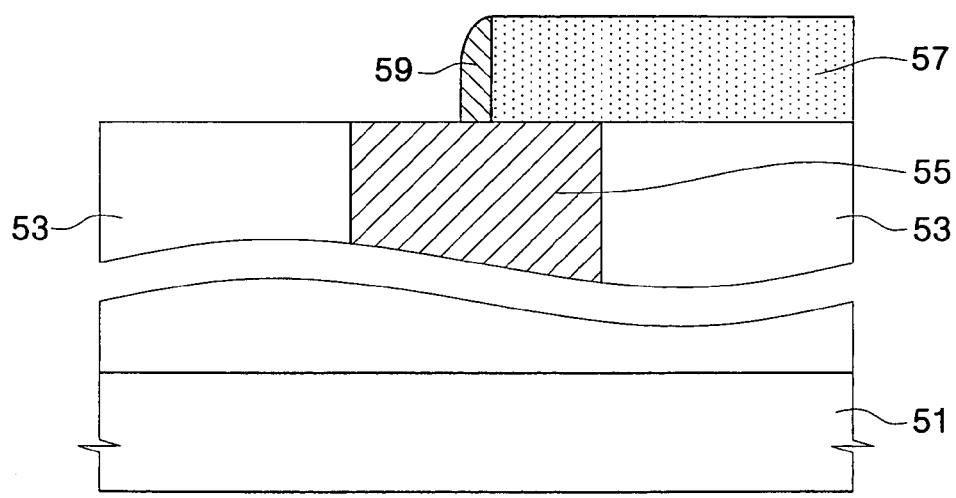

Referring to FIGS. 9 and 10, a conformal conductor is formed on the entire surface of the semiconductor substrate 51 having the first insulating layer pattern 57. The conductor may be formed of a titanium nitride (TiN) layer or a titanium aluminum nitride (TiAlN) layer having a thickness in a range of 50 Å to 200 Å.

The conductor is then anisotropically etched to form a conductive spacer 59 on a sidewall of the first insulating layer pattern 57. The conductive spacer 59 is electrically connected to the lower conductor pattern 55.

Figure 11:
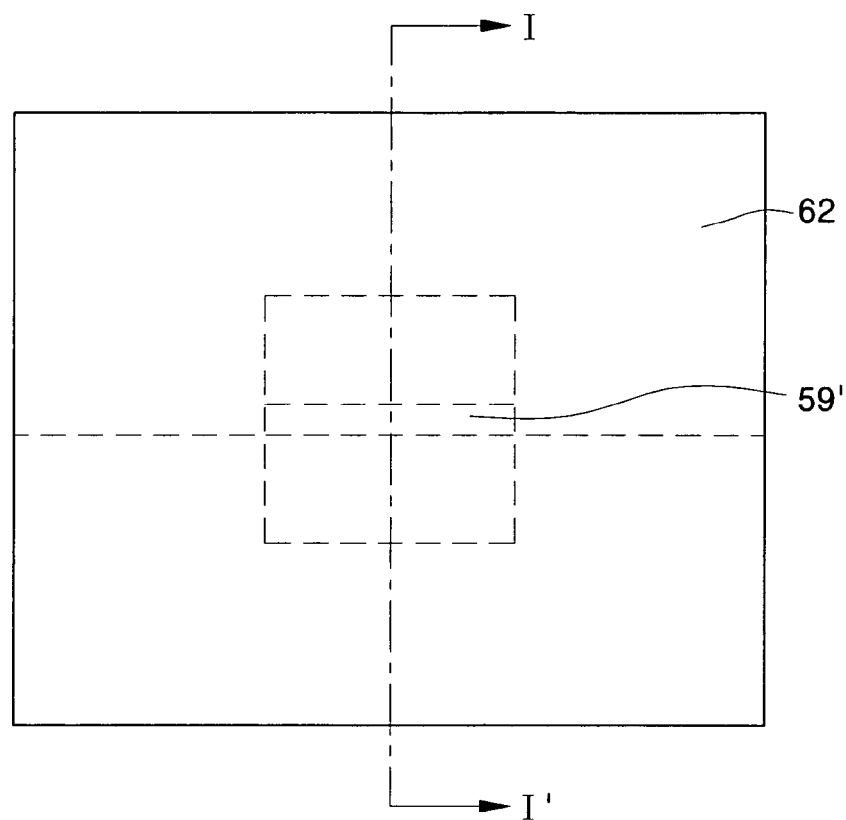
Figure 12:
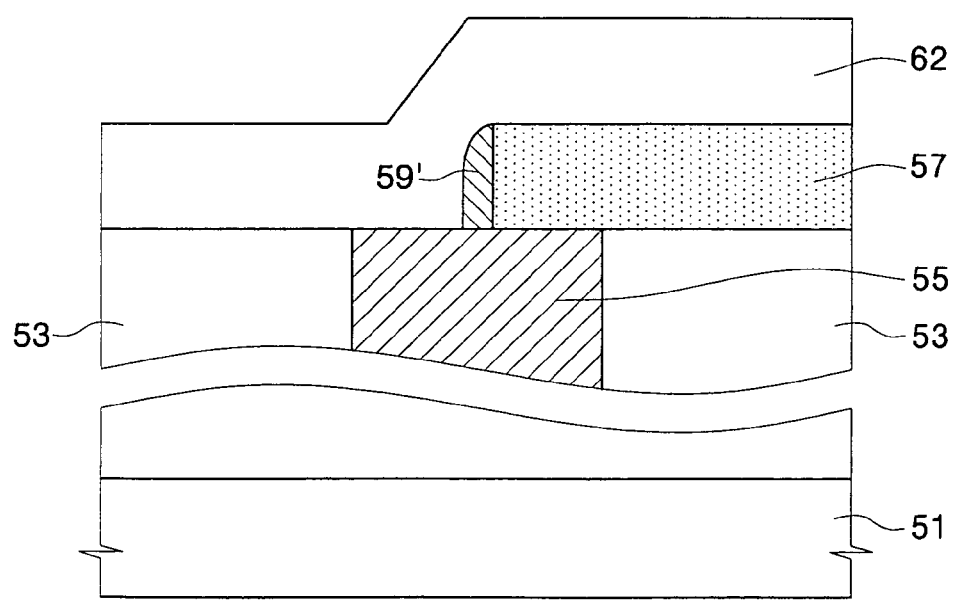

Referring to FIGS. 11 and 12, the conductive spacer 59 is patterned to form a conductive spacer pattern 59'. The process for patterning the conductive spacer 59 includes forming a photoresist pattern (not shown) covering the conductive spacer 59, isotropically etching the conductive spacer 59 using the photoresist pattern as an etch mask, and removing the photoresist pattern. In this case, the conductive spacer pattern 59' is locally formed on the top surface of the lower conductor pattern 55 and is electrically connected to the lower conductor pattern 55.

A first interlayer insulating layer 62 is conformally formed on the entire surface of the semiconductor substrate 51 having the conductive spacer pattern 59'. The first interlayer insulating layer 62 may be formed of a silicon oxide layer using a CVD method.

Figure 13:
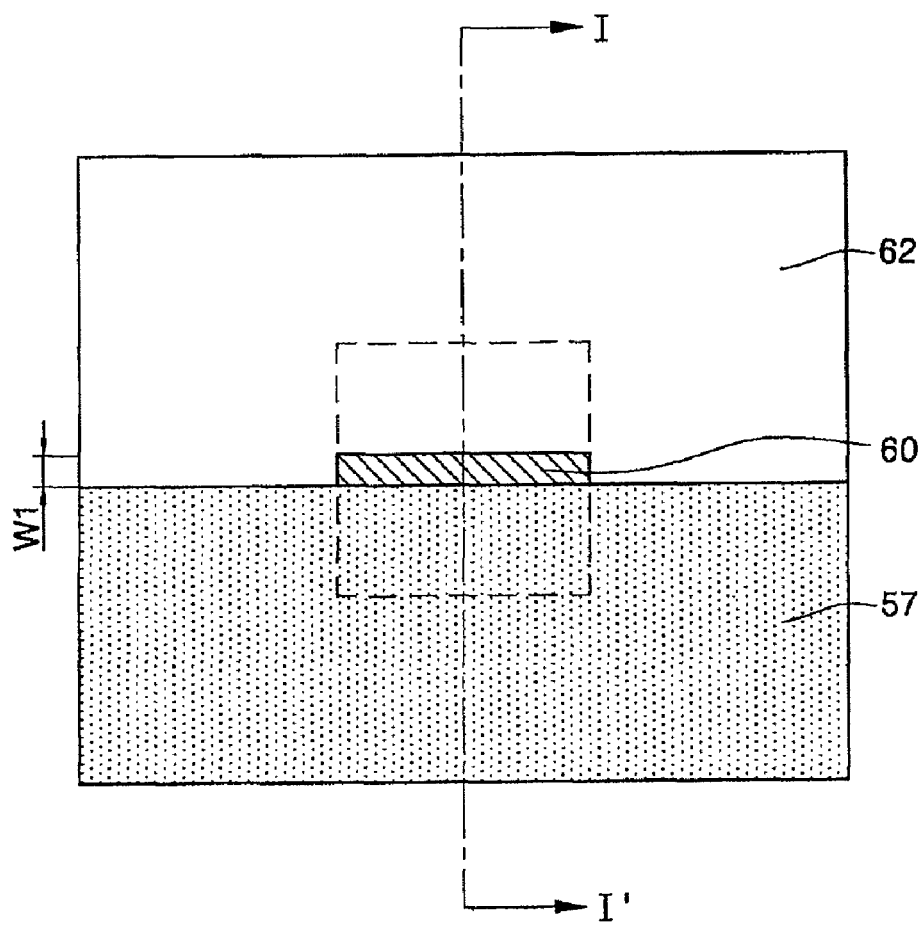
Figure 14A:
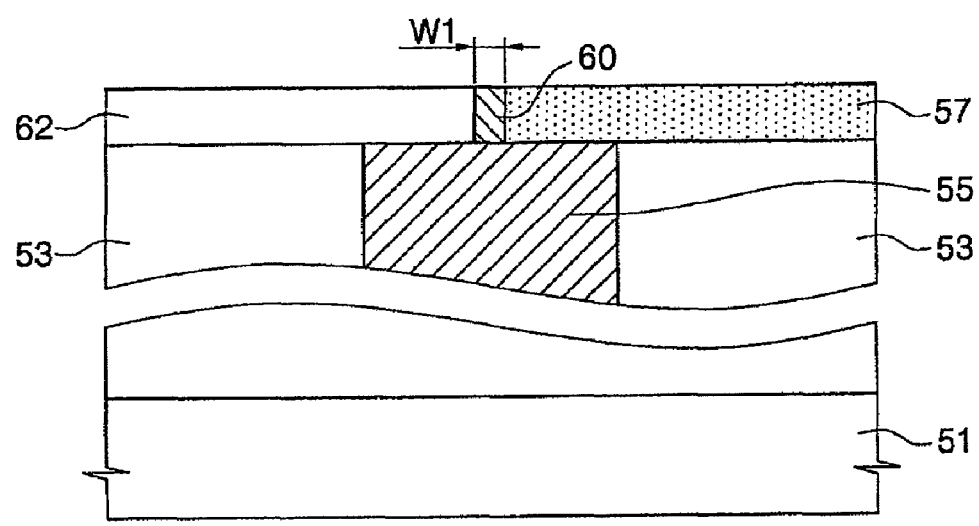

Referring to FIGS. 13 and 14A, the first interlayer insulating layer 62 and the conductive spacer pattern 59' are planarized to form a bottom electrode 60. A chemical mechanical polishing (CMP) process which employs the first insulating layer pattern 57 as a stopper may be used for the planarization. As a result, top surfaces of the bottom electrode 60, the first interlayer insulating layer 62 and the first insulating layer pattern 57 may be substantially exposed on the same surface. In this case, a width W1 of the bottom electrode 60 is determined by the deposition thickness of the conductor and the anisotropic etching to the conductor as described with reference to FIG. 10, so that it may be formed to be smaller than a limit of a photolithography process.

Figure 14B:
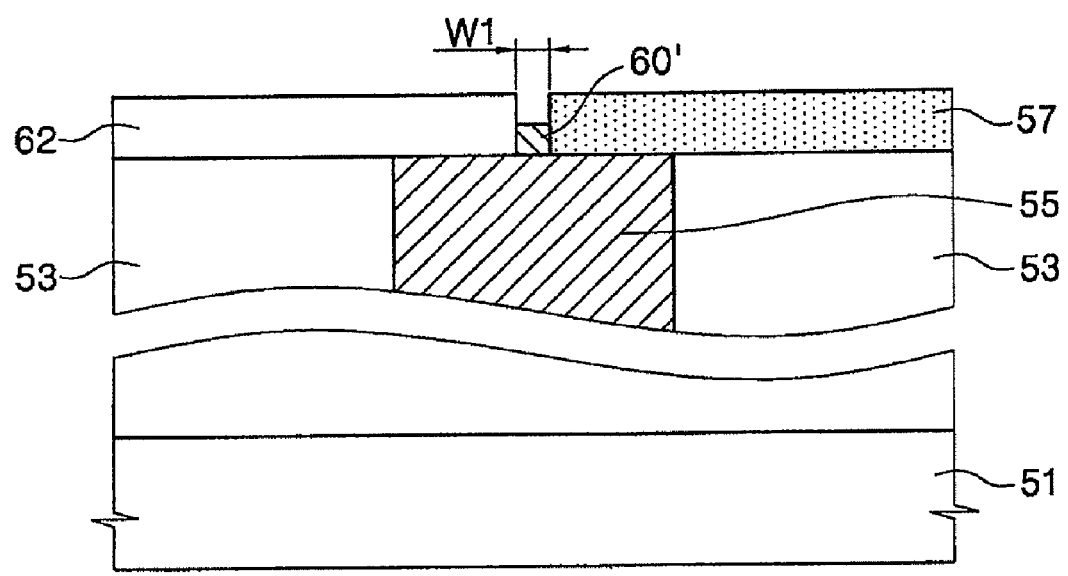
FIG. 14B is a schematic cross-sectional view taken along the line I-I' of FIG. 13, in accordance with other embodiments of the present invention.

Alternatively, referring to FIG. 14B, in other embodiments of the present invention, a process of forming and then etching the bottom electrode 60 to be recessed may be added. When the etching process is added, a top surface of the bottom electrode 60 may be recessed by 50 Å to 200 Å to be lower than top surfaces of the first interlayer insulating layer 62 and the first insulating layer pattern 57.

Figure 15:
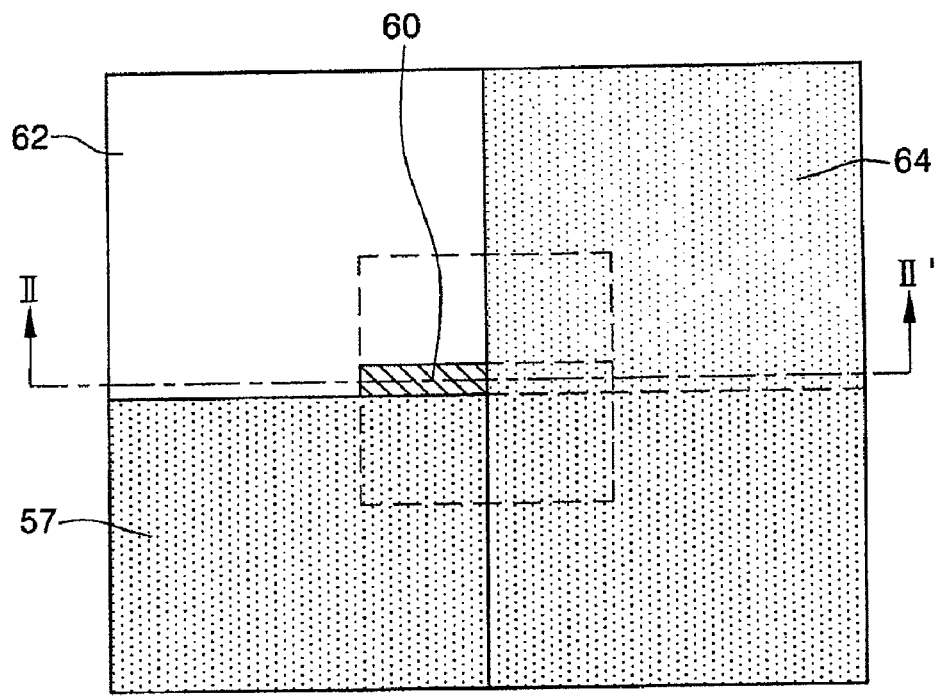
Figure 16A:
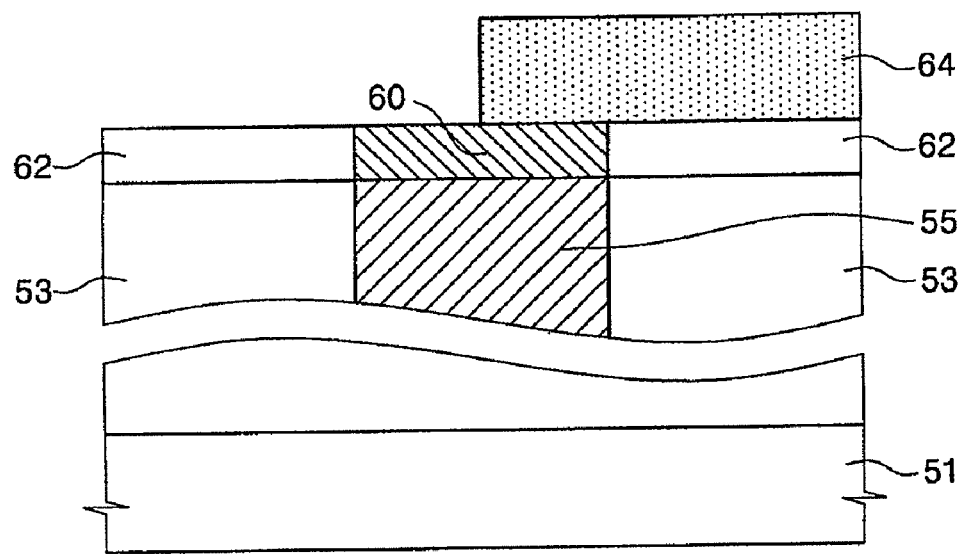
FIGS. 16A, 18, 20, 22, and 24 are schematic cross-sectional views taken along the line II-II' of FIGS. 15, 17, 19, 21, and 23, respectively.
Figure 16B:
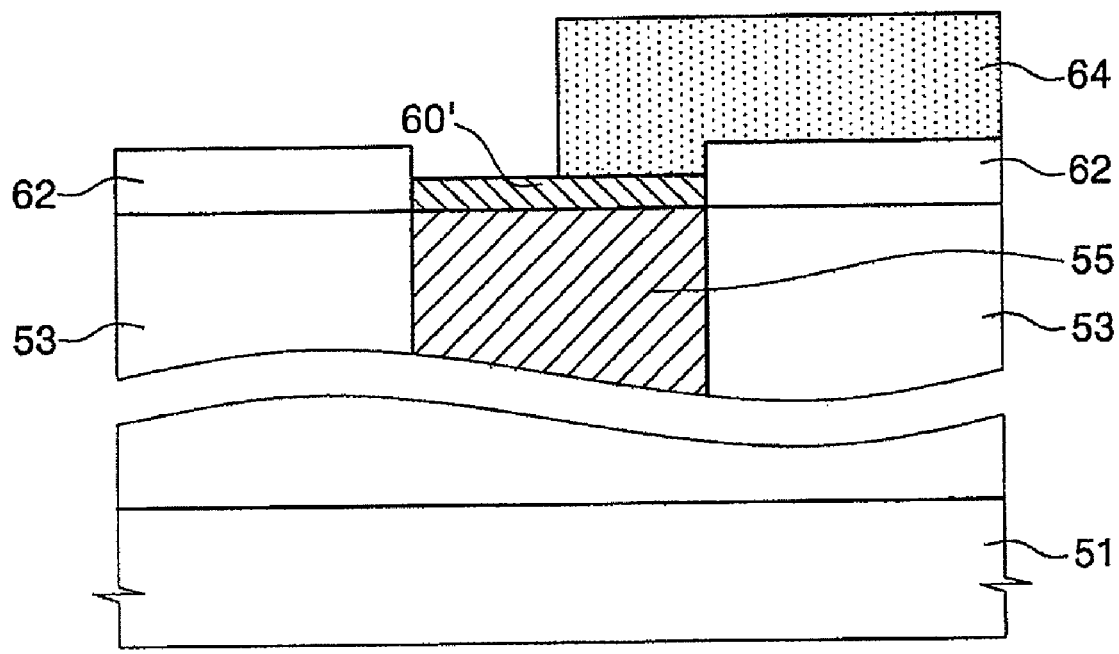
FIG. 16B is a schematic cross-sectional view taken along the line II-II' of FIG. 15, in accordance with other embodiments of the present invention.

Referring to FIGS. 15, 16A, and 16B, a second insulating layer is formed on the entire surface of the semiconductor substrate 51 having the bottom electrode 60 (FIG. 16A) or recessed bottom electrode 60' (FIG. 16B). The second insulating layer may be formed of a silicon nitride layer or a silicon oxynitride layer using a CVD method. The second insulating layer is then patterned to form a second insulating layer pattern 64 which crosses the bottom electrode 60 (FIG. 16A) or recessed bottom electrode 60' (FIG. 16B). As a result, a portion of the top surface of the bottom electrode 60 or recessed bottom electrode 60' is covered by the second insulating layer pattern 64 and the rest of the top surface of the bottom electrode 60 is exposed.

Figure 17:
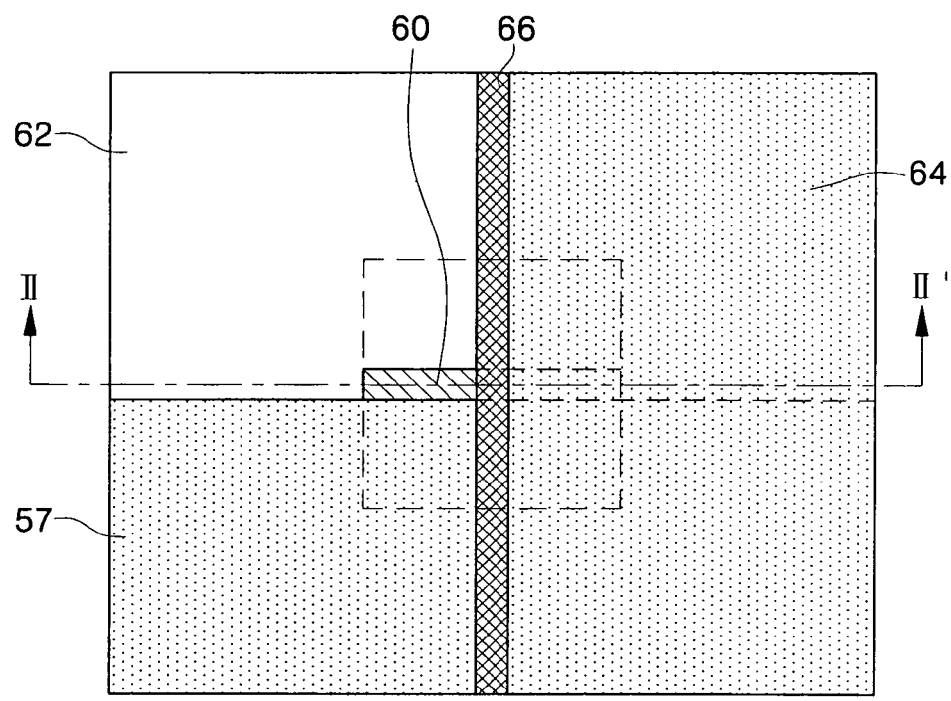
Figure 18:
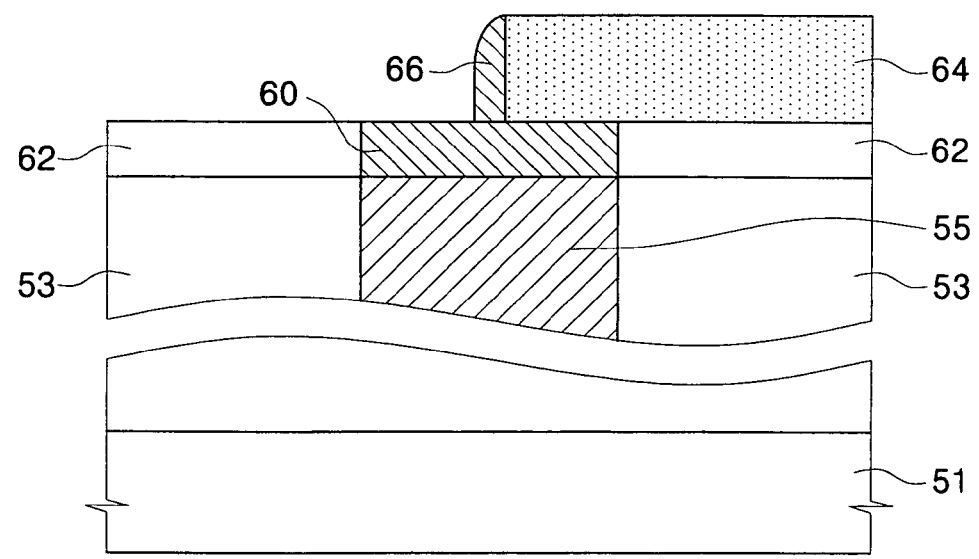

Referring to FIGS. 17 and 18, a phase change material layer is formed on the entire surface of the semiconductor substrate 51 having the second insulating layer pattern 64. The phase change material layer is anisotropically etched to form a phase change material spacer 66 on a sidewall of the second insulating layer pattern 64. The phase change material spacer 66 may be formed in a direction crossing the bottom electrode 60 and is electrically connected to the bottom electrode 60.

The phase change material layer may be formed of a chalcogenide layer. For example, the phase change material layer may be formed of an alloy layer of germanium (Ge), antimony (Sb), and tellurium (Te) (hereinafter, it will be referred to as a "GST alloy layer"). Furthermore, the phase change material layer may be formed of a GST alloy layer doped with at least one of nitride and silicon. In this case, the doped GST alloy layer has a resistivity higher than that of the undoped GST alloy layer. As a result, the doped GST alloy layer generates a Joule heat higher than that of the undoped GST alloy layer at the same current level. Accordingly, when the phase change material layer is formed of the doped GST alloy layer, phase transition efficiency of the phase change material layer may be improved.

Figure 19:
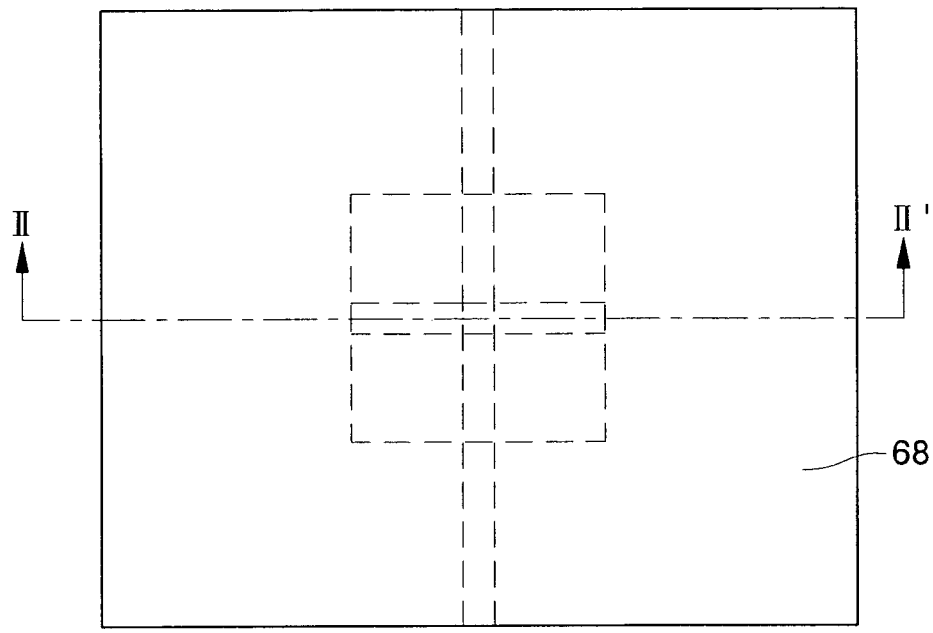
Figure 20:
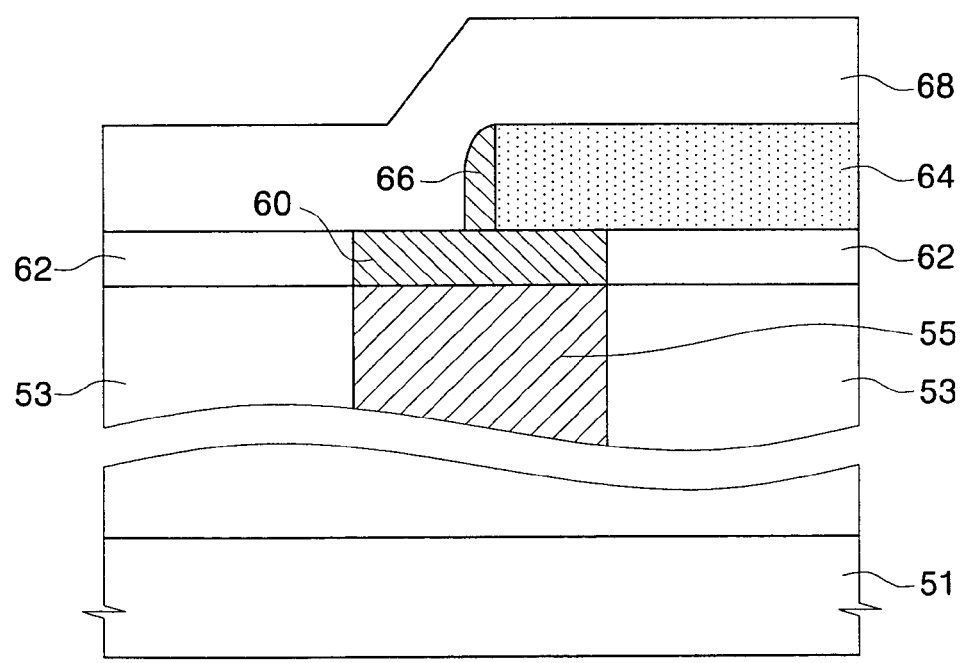

Referring to FIGS. 19 and 20, a second interlayer insulating layer 68 is conformally formed on the entire surface of the semiconductor substrate 51 having the phase change material spacer 66. The second interlayer insulating layer 68 may be formed of a silicon oxide layer using a CVD method.

Figure 21:
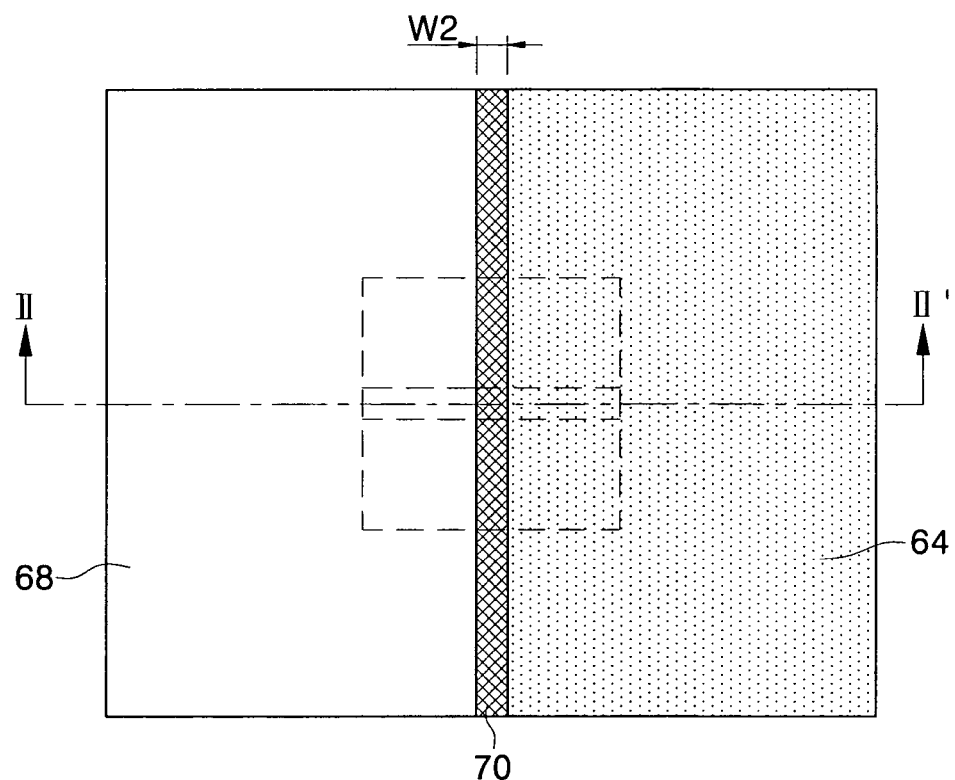
Figure 22:
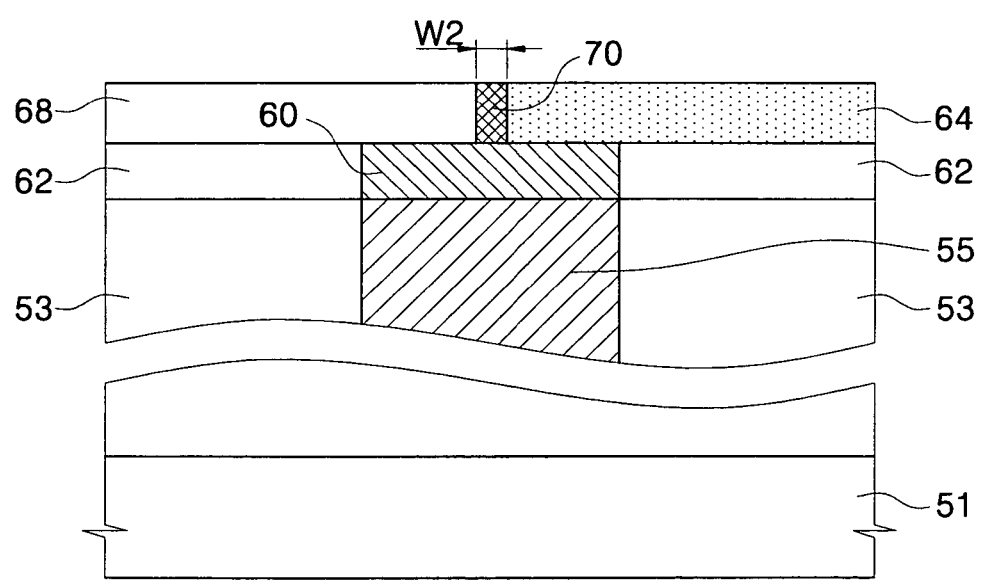

Referring to FIGS. 21 and 22, the second interlayer insulating layer 68 and the phase change material spacer 66 are planarized to form a phase change material pattern 70 which crosses a top surface of the bottom electrode 60 and is electrically connected to the bottom electrode 60. A CMP process which employs the second insulating layer pattern 64 as a stopper is used for the planarization. As a result, top surfaces of the phase change material pattern 70, the second interlayer insulating layer 68 and the second insulating layer pattern 64 may be substantially exposed on the same surface. In this case, a width W2 of the phase change material pattern 70 is determined by the deposition thickness of the phase change material layer and the anisotropic etching to the phase change material layer as described with reference to FIG. 18, so that it may be formed to be smaller than a limit of a photolithography process.

Figure 23:
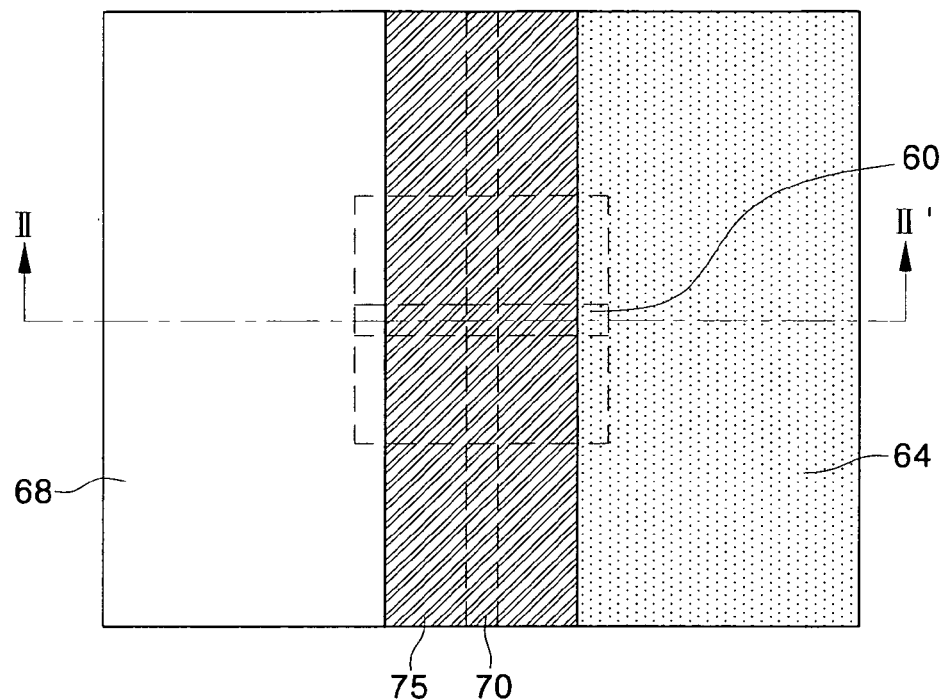
Figure 24:
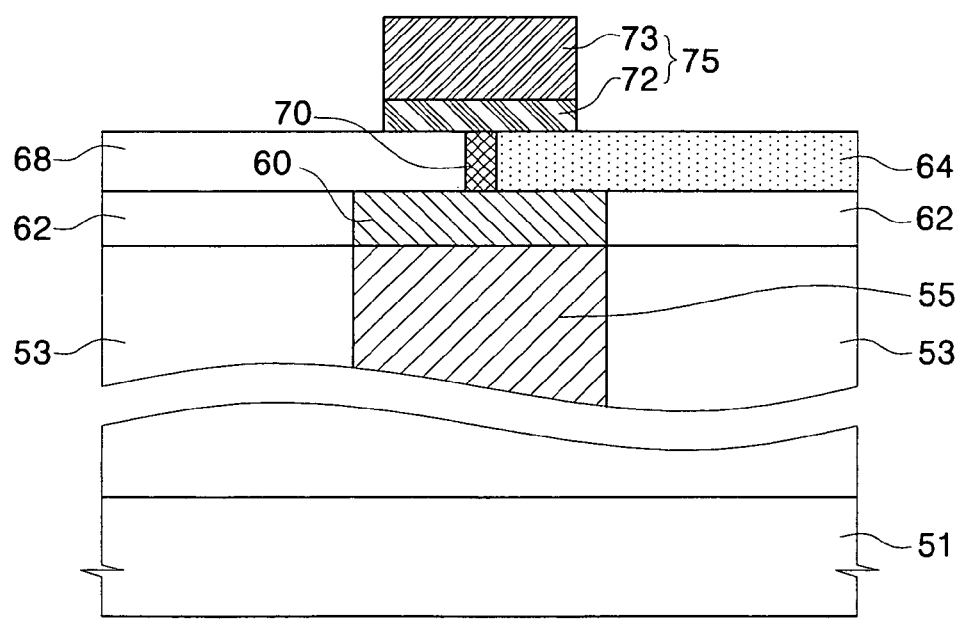

Referring to FIGS. 23 and 24, an upper interconnection 75 electrically connected to the phase change material pattern 70 is formed on the phase change material pattern 70. In detail, an upper metal layer covering the top surfaces of the phase change material pattern 70, the second interlayer insulating layer 68 and the second insulating layer pattern 64 is formed. A barrier metal layer may be further formed between the phase change material pattern 70 and the upper metal layer. The upper metal layer may be formed of a conductive layer such as aluminum. The barrier metal layer may be formed of at least one layer selected from a Ti layer and a TiN layer. The upper metal layer and the barrier metal layer are sequentially patterned to form an upper metal pattern 73 and a barrier metal pattern 72. The upper metal pattern 73 and the barrier metal pattern 72 which are sequentially stacked serve as the upper interconnection 75.

Referring to FIGS. 25 to 27, the bottom electrode 60 is formed on the lower conductor pattern 55. The phase change material pattern 70 is formed to cross the top surface of the bottom electrode 60. In addition, the upper interconnection 75 including the barrier metal pattern 72 and the upper metal pattern 73 sequentially stacked is formed on the phase change material pattern 70.

The bottom electrode 60 and the phase change material pattern 70 may be formed to intersect each other at a plane intersection angle of 0° to 90°. For example, the bottom electrode 60 and the phase change material pattern 70 may be formed to be orthogonal. The bottom electrode 60 and the phase change material pattern 70 may be formed to have widths smaller than a limit of a photolithography process. Accordingly, an active contact surface between the bottom electrode 60 and the phase change material pattern 70 may be minimized.

In addition, when a program current flows through the bottom electrode 60, an active volume portion V is formed in a hemisphere shape within the phase change material pattern 70. The active volume portion V having the hemisphere shape has a volume smaller than that of the conventional hemisphere. The smaller volume of the active volume portion V means that the active volume portion V may be converted to an amorphous state or a crystalline state even with a relatively small amount of program current. The relatively small program current has an advantage in that an area occupied by an access device may be decreased. That is, sufficient current drivability may be ensured even with the small-sized access device.

In addition, the phase change material pattern 70 is electrically connected to the upper interconnection 75. That is, a top electrode which is usually employed in the prior art may be omitted. Since the top electrode is not formed, a contact hole for forming the top electrode is not necessary, and a space for ensuring an overlap margin between the contact hole and the phase change material pattern 70 is also not required. Accordingly, the fabrication process may be simplified and a degree of integration of the phase change memory device may be enhanced.

According to the present invention as mentioned above, a bottom electrode and a phase change material pattern may be formed to have a width smaller than the limit of a photolithography process. An active contact surface between the bottom electrode and the phase change material pattern may be thus minimized. In addition, when a program current flows through the bottom electrode, an active volume portion having a hemisphere shape is formed within the phase change material pattern. The active volume portion having the hemisphere shape has a volume smaller than that of the conventional hemisphere. As a result, a current necessary for program operations of the phase change memory device may be decreased and a degree of integration thereof may be enhanced.

Preferred embodiments of the present invention have been disclosed herein and, although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

What is claimed is:

1. A method of fabricating a phase change memory device, comprising:

forming a first insulating layer pattern on a semiconductor substrate;

forming a conductive spacer pattern on a sidewall of the first insulating layer pattern;

forming a first interlayer insulating layer on the semiconductor substrate having the conductive spacer pattern;

planarizing the first interlayer insulating layer and the conductive spacer pattern to form a bottom electrode;

etching the bottom electrode to have a top surface of the bottom electrode recessed to be lower than top surfaces of the first interlayer insulating layer and the first insulating layer pattern;

forming a second insulating layer pattern on the semiconductor substrate having the recessed bottom electrode, the second insulating layer pattern crossing and directly contacting a top surface of the recessed bottom electrode and exposing a portion of the recessed bottom electrode;

forming a phase change material spacer electrically connected to the recessed bottom electrode on a sidewall of the second insulating layer pattern;

forming a second interlayer insulating layer on the semiconductor substrate having the phase change material spacer; and planarizing the second interlayer insulating layer and the phase change material spacer to form a phase change material pattern.

2. The method as recited in claim 1, wherein the first insulating layer pattern comprises at least one of a silicon nitride layer and a silicon oxynitride layer.

3. The method as recited in claim 1, wherein forming the conductive spacer pattern includes:

forming a conductor on the semiconductor substrate having the first insulating layer pattern;

anisotropically etching the conductor to form a conductive spacer on a sidewall of the first insulating layer pattern; and patterning the conductive spacer.

4. The method as recited in claim 1, wherein the bottom electrode comprises at least one of a titanium nitride (TiN) layer and a titanium aluminum nitride (TiAlN) layer.

5. The method as recited in claim 1, wherein the bottom electrode is formed to have a width smaller than a limit of a photolithography process.

6. The method as recited in claim 1, wherein the second insulating layer pattern comprises at least one of a silicon nitride layer and a silicon oxynitride layer.

7. The method as recited in claim 1, wherein forming the phase change material spacer includes:

forming a phase change material layer on the semiconductor substrate having the second insulating layer pattern; and anisotropically etching the phase change material layer.

8. The method as recited in claim 1, wherein the phase change material pattern is formed of a chalcogenide layer.

9. The method as recited in claim 1, wherein the phase change material pattern is formed of a GST(GeSbTe) alloy layer doped with at least one of nitride and silicon.

10. The method as recited in claim 1, wherein the phase change material pattern is formed to have a width smaller than a limit of a photolithography process.

11. The method as recited in claim 1, further comprising forming an upper interconnection electrically connected to the phase change material pattern on the second interlayer insulating layer and the second insulating layer pattern after the formation of the phase change material pattern.

12. The method as recited in claim 11, wherein the upper interconnection is formed of a barrier metal pattern and an upper metal pattern which are sequentially stacked.

13. The method as recited in claim 12, wherein the barrier metal pattern is formed of at least one layer selected from a titanium (Ti) layer and a titanium nitride (TiN) layer.

14. The method as recited in claim 1, wherein the bottom electrode and the phase change material pattern are formed to intersect each other at a plane intersection angle of 0° to 90°.

15. The method as recited in claim 1, wherein etching the bottom electrode includes forming a cavity between the top surfaces of the first interlayer insulating layer and the first insulating layer pattern, respectively, and the top surface of the recessed bottom electrode.

16. The method as recited in claim 1, wherein the top surface of the recessed bottom electrode is 50 Å to 200 Å lower than top surfaces of the first interlayer insulating layer and the first insulating layer pattern.

17. A method of fabricating a phase change memory device, comprising:

forming a lower conductor pattern on a semiconductor substrate;

forming a first insulating layer pattern on the semiconductor substrate having the lower conductor pattern, the first insulating layer pattern crossing a top surface of the lower conductor pattern and the first insulating layer pattern covering a first portion of the top surface of the lower conductor pattern and exposing a second portion of the top surface of the lower conductor pattern;

forming a conductive spacer pattern electrically connected to the exposed second portion of the lower conductor pattern on a sidewall of the first insulating layer pattern;

forming a first interlayer insulating layer on the semiconductor substrate having the conductive spacer pattern;

planarizing the first interlayer insulating layer and the conductive spacer pattern to form a bottom electrode;

etching the bottom electrode to have a top surface of the bottom electrode recessed to be lower than top surfaces of the first interlayer insulating layer and the first insulating layer pattern;

forming a second insulating layer pattern on the semiconductor substrate having the recessed bottom electrode, the second insulating layer pattern crossing and directly contacting a top surface of the recessed bottom electrode and exposing a portion of the recessed bottom electrode;

forming a phase change material spacer electrically connected to the recessed bottom electrode on a sidewall of the second insulating layer pattern;

forming a second interlayer insulating layer on the semiconductor substrate having the phase change material spacer;

planarizing the second interlayer insulating layer and the phase change material spacer to form a phase change material pattern; and forming an upper interconnection electrically connected to the phase change material pattern on the semiconductor substrate having the phase change material pattern.

18. The method as recited in claim 17, wherein the bottom electrode is formed to have a width smaller than a limit of a photolithography process.

19. The method as recited in claim 17, wherein the phase change material pattern is formed to have a width smaller than a limit of a photolithography process.

20. The method as recited in claim 17, wherein the bottom electrode and the phase change material pattern are formed to intersect each other at a plane intersection angle of 0° to 90°.

* * * * *

UNITED STATES PATENT AND TRADEMARK OFFICE
CERTIFICATE OF CORRECTION

| | | |
|---|---|---|
| PATENT NO. | : 7,465,675 B2 | Page 1 of 1 |
| APPLICATION NO. | : 11/149499 | |
| DATED | : December 16, 2008 | |
| INVENTOR(S) | : Gwan-Hyeob Koh | |

It is certified that error appears in the above-identified patent and that said Letters Patent is hereby corrected as shown below:

Title Page,
Item [56], References Cited, FOREIGN PATENT DOCUMENTS, add
--KR 04-22275     3/2004--.

Signed and Sealed this

Twenty-eighth Day of April, 2009

JOHN DOLL
*Acting Director of the United States Patent and Trademark Office*